US008255188B2

(12) United States Patent
Tabatabaei

(10) Patent No.: US 8,255,188 B2
(45) Date of Patent: Aug. 28, 2012

(54) FAST LOW FREQUENCY JITTER REJECTION METHODOLOGY

(75) Inventor: Sassan Tabatabaei, Sunnyvale, CA (US)

(73) Assignee: GuideTech, Inc., Sunnyvale, CA (US)

( * ) Notice: Subject to any disclaimer, the term of this patent is extended or adjusted under 35 U.S.C. 154(b) by 386 days.

(21) Appl. No.: 12/267,107

(22) Filed: Nov. 7, 2008

(65) Prior Publication Data

US 2009/0132207 A1  May 21, 2009

Related U.S. Application Data

(60) Provisional application No. 60/986,147, filed on Nov. 7, 2007.

(51) Int. Cl.
*H04B 15/00* (2006.01)
(52) U.S. Cl. .............. 702/191; 702/69; 702/75; 702/79; 702/176; 702/188; 702/189; 702/195; 702/199
(58) Field of Classification Search .................. 702/69, 702/75, 176, 195, 199
See application file for complete search history.

(56) References Cited

U.S. PATENT DOCUMENTS

| 4,757,452 | A | 7/1988 | Scott et al. |
|---|---|---|---|
| 4,908,784 | A | 3/1990 | Box et al. |
| 4,982,350 | A | 1/1991 | Perna et al. |
| 6,091,671 | A | 7/2000 | Kattan |
| 6,185,509 | B1 | 2/2001 | Wilstrup et al. |
| 6,194,925 | B1 | 2/2001 | Kimsal et al. |
| 6,246,737 | B1 | 6/2001 | Kuglin |
| 6,298,315 | B1 | 10/2001 | Li et al. |
| 6,356,850 | B1 | 3/2002 | Wilstrup et al. |
| 6,452,518 | B1 * | 9/2002 | Kawabata ..................... 341/118 |
| 6,665,808 | B1 | 12/2003 | Schinzel |
| 6,701,269 | B1 | 3/2004 | Jungerman et al. |
| 6,701,280 | B2 | 3/2004 | Horne et al. |
| 6,822,485 | B2 | 11/2004 | Kattan |
| 6,832,172 | B2 | 12/2004 | Ward et al. |
| 6,876,938 | B2 | 4/2005 | Kattan |
| 6,898,535 | B2 | 5/2005 | Draving |
| 6,931,335 | B2 | 8/2005 | Mueller |
| 6,931,338 | B2 | 8/2005 | Kattan |
| 6,999,382 | B2 | 2/2006 | Horne |
| 7,003,180 | B2 | 2/2006 | Richardson et al. |
| 7,076,385 | B2 | 7/2006 | Horne et al. |
| 7,164,999 | B2 | 1/2007 | Tabatabaei et al. |
| 7,203,610 | B2 | 4/2007 | Tabatabaei et al. |
| 7,239,969 | B2 | 7/2007 | Tabatabaei et al. |
| 7,292,947 | B1 | 11/2007 | Tabatabaei |
| 7,400,988 | B2 | 7/2008 | Tabatabaei |
| 7,512,196 | B2 | 3/2009 | Tabatabaei |

(Continued)

OTHER PUBLICATIONS

Technical Document—*Jitter Separation-50 Mb/s to Over 40 Gb/s Using the Agilent 86100C Infiniium DCA-J*; pp. 1 through 27, Agilent Technologies, Inc., Dec. 2003.

(Continued)

*Primary Examiner* — Michael Nghiem
*Assistant Examiner* — Paul D Lee
(74) *Attorney, Agent, or Firm* — Dority & Manning, P.A.

(57) ABSTRACT

Disclosed is a system and related methodology for providing fast low frequency jitter rejection in the measurement of signals under test. A signal under test may be sampled alternately with a reference signal under similar conditions. The resulting sampled signal blocks may then be processed to subtract the known calibrated value of the reference signal from the average signal under test.

18 Claims, 3 Drawing Sheets

U.S. PATENT DOCUMENTS

| | | |
|---|---|---|
| 2002/0084972 A1 | 7/2002 | Kim |
| 2002/0103618 A1* | 8/2002 | Schleifer et al. .............. 702/176 |
| 2002/0174159 A1 | 11/2002 | Laquai |
| 2003/0041294 A1 | 2/2003 | Moll et al. |
| 2003/0125888 A1 | 7/2003 | Yamaguchi et al. |
| 2003/0223376 A1 | 12/2003 | Elliott et al. |
| 2004/0136450 A1 | 7/2004 | Guenther |
| 2004/0143406 A1 | 7/2004 | Nishikobara et al. |
| 2004/0158462 A1 | 8/2004 | Rutledge et al. |
| 2004/0208129 A1 | 10/2004 | Old et al. |
| 2005/0044463 A1 | 2/2005 | Frisch |
| 2005/0075810 A1 | 4/2005 | Laquai |
| 2005/0097420 A1 | 5/2005 | Frisch et al. |
| 2005/0152488 A1 | 7/2005 | Buckwalter et al. |
| 2005/0177758 A1 | 8/2005 | Stickle |
| 2005/0243960 A1 | 11/2005 | Jungerman |
| 2005/0286670 A1 | 12/2005 | Jungerman |
| 2006/0045175 A1 | 3/2006 | Draving et al. |
| 2006/0047450 A1* | 3/2006 | Tabatabaei et al. .............. 702/69 |
| 2007/0110146 A1 | 5/2007 | Tabatabaei |
| 2007/0133726 A1 | 6/2007 | Nadig et al. |
| 2007/0233444 A1* | 10/2007 | O'Mahony et al. .............. 703/14 |
| 2009/0019324 A1 | 1/2009 | Miller et al. |

OTHER PUBLICATIONS

Technical Document—*Analyzing Jitter Using a Spectrum Approach*; pp. 1 through 8; Tektronix, Inc., 2002.

Technical Document—*Measuring Jitter in Digital Systems*, Application Note 1448-1, pp. 1 through 16, Agilent Technologies, Inc., Jun. 2003.

\* cited by examiner

FAST LOW FREQUENCY JITTER REJECTION METHODOLOGY

CROSS REFERENCE TO RELATED APPLICATIONS

This application claims priority under 35 U.S.C. §119(e) of Provisional U.S. Patent Application Ser. No. 60/986,147 filed Nov. 7, 2007, entitled "FAST LOW FREQUENCY JITTER REJECTION METHODOLOGY," which is incorporated herein by reference in its entirety for all purposes.

FIELD OF THE INVENTION

The present subject matter is directed to a system and related methodology for reducing the impact of very low frequency jitter for measuring timing parameters, such as relative average signal period, skew, propagation delay, and time interval error (TIE). The method uses interleaved sampling to compare two average values without being subject to very low frequency jitter while maintaining short sampling time.

BACKGROUND OF THE INVENTION

Many parametric measurements are subject to different types of noise. The sources of the noise could be from the signal or circuit under test, or from the measurement instrument. Averaging has been used to increase the measurement precision and repeatability for static parameters. Examples of such parameters include DC voltage or current, clock period, signal skew, or device propagation delay.

Typically, when an average quantity is to be measured, a number of samples are taken within the data acquisition window and the results averaged. If the noise frequency is larger than the inverse of the averaging window, the standard deviation of the average quantity from one measurement to the next will reduce as below:

$$\bar{s} = \frac{1}{N}\sum_{i=1}^{N} s_i \rightarrow \sigma_{\bar{s}} = \frac{1}{\sqrt{N}}\sigma_s \qquad \text{Equation 1}$$

where $s_i$ are the individual samples of the parameter to be measured, N is the number of samples, $\bar{s}$ is the average over N samples, and $\sigma_X$ denotes the standard deviation of parameter X.

FIG. 1 illustrates an exemplary frequency response of an averaging process. As evident from FIG. 1, the averaging process is effective for reducing noise or jitter at frequencies greater than $1/10^{th}$ of the inverse of the averaging window. This means that the lower frequency noise can result in measurement error, especially if the low frequency noise power is substantial. Examples of such noises include 1/f flicker noise in CMOS devices and $1/f^2$ phase noise in oscillators.

One solution for reducing the impact of low frequency noise is to use a longer averaging window. This, however, has the disadvantages of increased measurement time and reduced effectiveness if the low frequency noise power spectrum has $1/f^n$ ($n \geq 1$) characteristics.

While various methodologies for compensating for low frequency jitter have been developed, no design has emerged that generally encompasses all of the desired characteristics as hereafter presented in accordance with the subject technology.

SUMMARY OF THE INVENTION

In view of the recognized features encountered in the prior art and addressed by the present subject matter, an improved measurement system and related methodology for reducing the impact of very low frequency jitter for measuring timing parameters.

In an exemplary configuration, samples of a signal under test are taken alternately with samples of a reference signal.

In one of their simpler forms, alternating signals under test and a known reference signal are coupled to a measurement instrument.

In accordance with aspects of certain embodiments of the present subject matter, methodologies are provided to sample plural signals under test in a repeating sequence with a single reference signal.

It should be appreciated that the present subject matter equally concerns an apparatus and system for implementing the aforementioned exemplary steps. For example, a processor circuit may be coupled to an input circuit and a measurement channel that obtains signal measurements. Such hardware components are configured to implement an alternate sampling technique whereby at least one signal under test and a reference signal are alternately sampled in an interleaved fashion such that the signal under test is sampled in one block and the reference signal is sampled in a subsequent block. This alternate sampling process is repeated until N samples (for some positive integer N) of the at least one signal under test and the reference signal are collected in a series of interleaved sampled waveform blocks. At least one measurement characteristic is obtained for the interleaved sampled waveform blocks. An output, such as visually provided on a display device or printed by a peripheral device may be provided to a user to indicate the measurement characteristics. In one embodiment, the measurement characteristics correspond to an average value of samples of the reference signal (from which a reference signal calibration value is subtracted), and an average value of samples of the signal under test. The average of the reference signal samples may then be subtracted from the average of the signal under test samples to provide a measurement with reduced low frequency noise or jitter.

In one embodiment, the processor circuit within a measurement instrument more particularly includes a computer-readable medium for storing executable instructions corresponding to the aforementioned steps and other steps desired in the subject signal analysis. The computer-readable medium may correspond to one or more of a server database, a magnetic tape or disk, a CD-ROM, a flash or other nonvolatile memory, etc. The exact type of memory or storage medium should not be limiting to the present invention. The processor circuit further includes a computer coupled to the readable medium that is adapted to execute the software instructions stored on the computer-readable medium.

Additional objects and advantages of the present subject matter are set forth in, or will be apparent to, those of ordinary skill in the art from the detailed description herein. Also, it should be further appreciated that modifications and variations to the specifically illustrated, referred and discussed features and elements hereof may be practiced in various embodiments and uses of the invention without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures).

Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
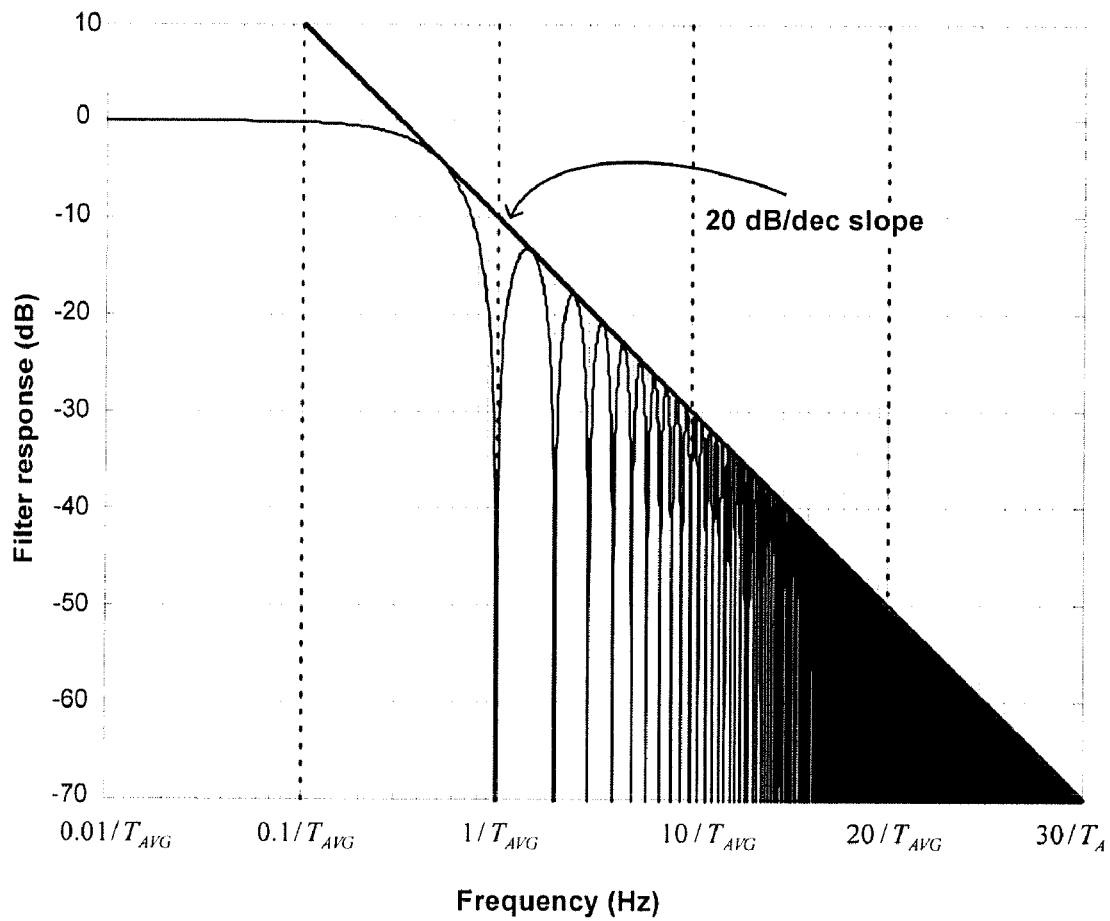
FIG. 1 illustrates an averaging filter frequency response.

Repeat use of reference characters throughout the present specification and appended drawings is intended to represent same or analogous features or elements of the invention.

DETAILED DESCRIPTION OF THE PREFERRED EMBODIMENTS

As discussed in the Summary of the Invention section, the present subject matter is particularly concerned with a measurement methodology that is effective in reducing any type of low frequency noise or jitter that may be due to the measurement equipment. In accordance with the present technology, this method is based on interleaved sampling techniques where samples of a signal under test (SUT) and a reference signal are interleaved in multiple blocks. In an exemplary configuration, the present methodology has been applied for the measurement of relative propagation delay in delay line devices using the continuous time interval analyzer (CTIA) from Guidetech, Inc. This method is generally applicable to any measurement that requires averaging to improve measurement precision and accuracy.

Selected combinations of aspects of the disclosed technology correspond to a plurality of different embodiments of the present invention. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Figure 2A:
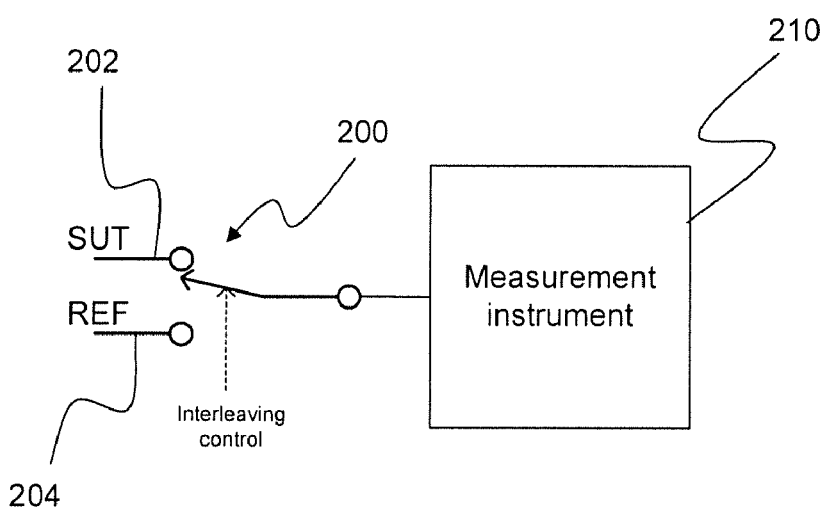
FIG. 2A illustrates a portion of exemplary measurement apparatus for use in an interleaved sampling methodology in accordance with the present technology.
Figure 2B:
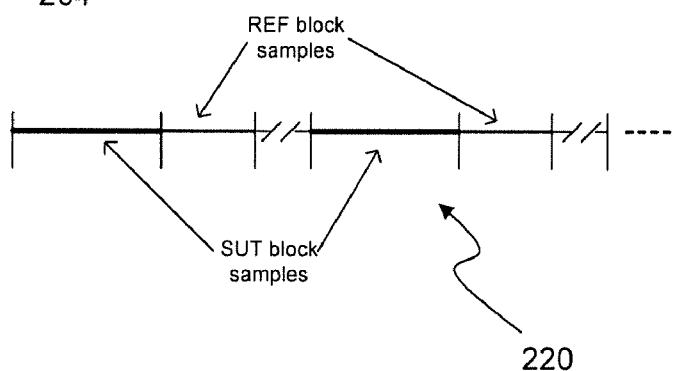
FIG. 2B illustrates representative interleaved sampled waveform blocks as may be presented to measurement equipment in accordance with the present technology.

Reference will now be made in detail to the presently preferred embodiments of the subject interleaved sampling methodology. Referring now to the drawings, FIGS. 2A and 2B illustrate, respectively, a portion of exemplary sampling circuitry 200 and resultant representative sampled waveform blocks 220 as may be presented to a measurement instrument 210 in accordance with the present technology.

Figure 3:
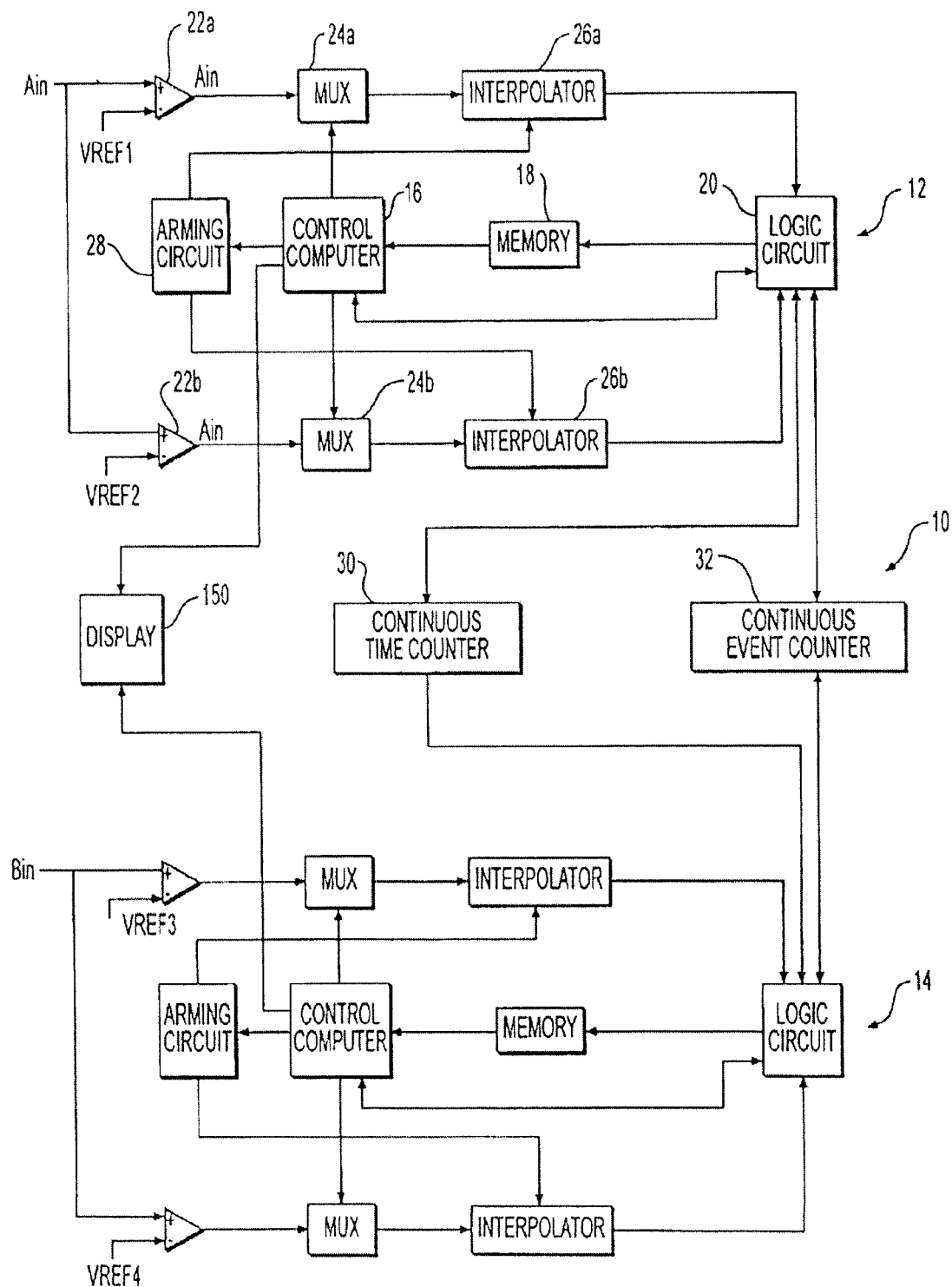
FIG. 3 provides a schematic diagram illustration of exemplary hardware components for obtaining and analyzing signal measurements in accordance with aspects of the present invention.

As previously mentioned, one example of a measurement instrument 210 that may be utilized to implement the processing steps described herein is a CTIA offered for sale by Guidetech Inc. of Sunnyvale, Calif., such as but not limited to a FEMTO® 2000 or GT 4000 model time interval analyzer. FIG. 3 provides a schematic representation of exemplary hardware components contained within such a measurement unit. Although some aspects of the hardware components of FIG. 3 are discussed herein, additional discussion of these and other components of a measurement instrument that may be utilized in conjunction with certain aspects of the present invention are disclosed in U.S. Pat. No. 6,091,671 (Kattan), which is incorporated herein by reference for all purposes.

The time interval analyzer 10 of FIG. 3 includes two channels indicated at 12 and 14. Each channel includes a control computer 16, for example a 200 MHz DSP processor, with associated memory 18, for example a high performance FIFO memory, and logic circuit 20. Alternatively, the channels may share a common computer, memory and logic circuit, which may collectively be referred to as a processor circuit. Each channel, in turn, includes parallel measurement circuits having comparators 22a and 22b, multiplexers 24a and 24b and interpolators 26a and 26b. That is, each channel includes multiple, in this case, two measurement circuits. An arming circuit 28 is controlled by computer 16 to trigger the interpolators. A continuous time counter 30 and continuous event counter 32 provide time and event counts to both channels 12 and 14. Alternatively, each measurement circuit may have its own time counter and event counter, provided that the respective counters for each measurement circuit are synchronized.

The first measurement circuit 22a-26a/20 of each channel may be referred to as the "start" measurement circuit, while the second measurement circuit 22b-26b/20 may be referred to as the "stop" measurement circuit. Generally, time interval analyzer 10 measures characteristics of a desired signal by comparing the time and/or event measurements of the start circuit with that of the stop circuit. The particular measurement depends upon the signal selected at multiplexers 24a and 24b and upon the manner in which arming circuit 28 arms the interpolators. For example, if the start circuit passes the $A_{in}$ signal from comparator 22a as shown in FIG. 3, if the stop circuit multiplexer passes the inverse of the $A_{in}$ signal from comparator 22b, and if the interpolator 26b is armed immediately following interpolator 26a, but before the expiration of a period equal to the input signal pulse width, the difference between the time portions of the start and stop measurement tags is equal to the pulse width. Other exemplary measurements of various signal characteristics may include but are not limited to signal skew, signal period, propagation delay and time interval error (TIE).

Once an interpolator has measured a signal edge, the logic circuit 20 instructs computer 16 to read the interpolator measurement from a capacitor within the interpolator whose charge or discharge is representative of a time signal that corresponds to the occurrence of the measured signal edge relative to a predetermined time reference. Computer 16 is also instructed to read the time and event counts from counters 30 and 32. It then downloads the time and event counts to memory 18, from which computer 16 retrieves the information to assign to the signal measurement. In this manner, the processor circuit correlates the measured signal edge with time and event measurements from the counters. Thus a "measurement tag" indicates the time the signal edge occurred and the edge's position within the sequence of edges. Control computer 16 repeatedly reads the memory to perform a desired analysis and/or to display the measured information at a display device 150, for example a video monitor.

Time interval analyzers such as the one illustrated in FIG. 3 are capable of generating time interval error (TIE) data as well as absolute time tags (referenced to the first sample) for selected edges within a data stream. TIE can be generally described as the time displacement between a given signal edge (or event) and its ideal location determined from an average unit interval, or average bit time. The sampling rate of a data stream is typically much less than the bit rate for a data stream since the measurement circuitry must have an opportunity to settle and recharge (or discharge) after a given measurement to ensure the accuracy of a subsequent measurement. Since the sampling rate is lower than the bit rate, TIE data obtained by a time interval analyzer is effectively an undersampled sequence of total TIE.

Referring again to FIG. 2A, the interleaved sampling methodology of the present technology uses a reference signal with small low frequency noise and interleaved block sampling methodology to compare the desired parameters in the signal under test (SUT) 202 with that of a reference signal (REF) 204. In interleaved sampling, the total samples are divided into multiple sampling blocks. The sampling process includes measuring the SUT 202 signal in one block, sampling the reference signal 204 in the next, and repeating the process until N samples of the SUT 202 signal is collected.

In an alternative configuration, this methodology can be extended to measuring parameters of more than one SUT. For example, for two SUTs, the interleaved sampling can be implemented by sampling the first SUT1 in one block, the SUT2 in the next block, the reference signal in the third block, and then repeating the sequence until desired number of samples for each of SUT1 and SUT2 are collected.

Once the sampling is completed, the average of REF samples minus the known calibrated value of the REF parameter is subtracted from the average of SUT samples, as below:

$$s_{avg} = \frac{1}{N_s}\sum_{i=1}^{N_s} s_i - \left(\frac{1}{N_r}\sum_{j=1}^{N_r} r_j - r_{cal}\right) \qquad \text{Equation 2}$$

where $s_{avg}$ is the SUT parameter average that is to be measured, $s_i$ (i=1, ..., $N_s$) are the SUT samples, $N_s$ is the total number of SUT samples taken, $r_j$ (j=1, ..., $N_r$) are the REF samples, $N_r$ is the total number of REF samples taken, and $r_{cal}$ is the calibrated value of the REF signal parameter. The $r_{cal}$ may be eliminated from the Equation 2 when the objective is to measure the difference of the SUT and REF parameter averages or SUT1 and SUT2 parameter averages.

In an exemplary configuration, the time duration of each sampling blocks may be set to be at least 10 times smaller than the inverse of the upper threshold of the low frequency noise that is to be filtered. This effectively ensures that the low frequency noise impacts the SUT samples and the reference samples is a similar fashion, and will be cancelled out to a large extent due to the subtraction process shown in Equation 2.

In one example, the following conditions are met for effective low frequency rejection using interleaved sampling:

1. The duration of each of SUT and REF sampling blocks should be less than $\frac{1}{20} f_{LF}$, where $f_{LF}$ is the upper threshold of the low frequency noise to be filtered.
2. The combined time duration for a pair of SUT and REF blocks should be less than $\frac{1}{10} f_{LF}$.
3. The time between pairs of block can be large, because the closely sampled SUT and REF blocks already share the same low frequency noise impact.

An example of measurement subject to low frequency noise is propagation delay measurement for programmable delay lines. In an exemplary configuration, a GuideTech CTIA may be used for such measurement. A typical test parameter for such devices is to compare the device delays for two or more delay settings. This application lends itself very well to the interleaved sampling methodology because:

1. The delay for one delay control setting can be used as reference. This means that there is no need to have a separate calibrated reference.
2. No need for a switch in front of the test instrument. The switching between two different delay values is achieved through the delay control input signals.

In accordance with present technology, the input and output signals of a device under test (DUT) are connected to two inputs of the CTIA. The CTIA is programmed to measure multiple blocks of skew between the input and output of the DUT, which determines the propagation delay of the DUT. The block arming capability of the CTIA is used to synchronize the block measurements with the DUT delay switching. Multiple blocks of skew data are collected in the interleaved fashion, as described previously. The average skew for one delay setting is subtracted from the average skew for the other delay setting. Using this approach, the propagation difference between the two settings can be measured within 100 fs RMS accuracy in less than 50 ms.

In accordance with the present technology, there has been disclosed a methodology for fast and very high precision average parametric measurements in the presence of the low frequency noise in the measurement instrument. This methodology relies on interleaved sampling of the signal user test and that of a reference signal. This effectively provides an estimate of low frequency noise in the reference signal, which can be used to eliminate it in the SUT measurements. While specific examples of potential use for the methodology of the present subject matter have been presented, those of ordinary skill in the art will appreciate that the methodology can be used in many different applications.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed:

1. A method of measuring signals provided from a device under test to reduce low frequency measurement instrument noise, said method comprising the steps of:
    providing at least one signal under test from a device under test to a measurement instrument;
    providing a reference signal to the measurement instrument;
    alternately sampling the at least one signal under test and the reference signal in an interleaved fashion such that the signal under test is sampled in one block and the reference signal is sampled in a subsequent block;

repeating the alternate sampling process until N samples of the at least one signal under test and the reference signal are collected in a series of interleaved sampled waveform blocks, wherein N is a positive integer;

measuring at least one signal characteristic of the interleaved sampled waveform blocks;

providing an output indicative of the at least one measured signal characteristic;

averaging selected samples obtained from the at least one signal under test;

averaging selected samples obtained from the reference signal; and subtracting the average of the selected reference signal samples from the average of the selected signal under test samples.

2. The method of claim 1, wherein multiple signals under test are provided to the measurement instrument, and wherein the alternate sampling process comprises respectively sampling each of the multiple signals under test and then the reference signal such that each measurement block includes one sample from each signal under test and one sample from the reference signal.

3. The method of claim 1, further comprising the step of providing a calibrated value of a predetermined parameter for the reference signal, and subtracting the calibrated value from the average of the selected reference signal samples before the average of the selected reference signal samples is subtracted from the average of the selected signal under test samples.

4. The method of claim 1, wherein the time duration of each sampled block of the at least one signal under test and the reference signal is at least ten times smaller than the inverse of an upper threshold of the low frequency noise that is to be reduced.

5. The method of claim 1, further comprising a step of providing a sampling circuit for receiving the at least one signal under test and the reference signal; wherein the alternate sampling process is implemented by the sampling circuit; and wherein the interleaved sampled waveform blocks are provided from the sampling circuit to the measurement instrument.

6. The method of claim 1, wherein said step of measuring at least one signal characteristic comprises measuring the propagation delay between at least one input and at least one output of the device under test.

7. The method of claim 6, wherein the at least one signal under test provided to the measurement instrument comprises the at least one input of the device under test, and wherein the reference signal provided to the measurement instrument comprises the at least one output of the device under test.

8. A measurement instrument configured to measure at least one signal characteristic associated with at least one signal under test, said measurement instrument comprising:

an input circuit adapted to receive at least one signal under test from a device under test and a reference signal;

a processor circuit coupled to said input circuit, said processor circuit configured to control the input circuit to alternately sample the at least one signal under test and the reference signal in an interleaved fashion such that the signal under test is sampled in one block and the reference signal is sampled in a subsequent block; and wherein the alternate sampling process implemented by the input circuit is repeated until N samples of the at least one signal under test and the reference signal are collected in a series of interleaved sampled waveform blocks, for some positive integer N;

at least one measurement channel coupled to said input circuit and to said processor circuit, said at least one measurement channel adapted to receive the series of interleaved sampled waveform blocks from the input circuit and to measure at least one signal characteristic of the interleaved sampled waveform blocks, wherein said processor circuit is further configured to average selected samples obtained from the at least one signal under test; average selected samples obtained from the reference signal; and subtract the average of the selected reference signal samples from the average of the selected signal under test samples.

9. The measurement instrument of claim 8, wherein said input circuit comprises an interleaving control configured to selectively switch between the at least one signal under test and the reference signal.

10. The measurement instrument of claim 8, wherein said input circuit comprises arming circuitry within the measurement instrument.

11. The measurement instrument of claim 8, wherein said processor circuit comprises:

a computer-readable medium for storing executable instructions corresponding to the steps of alternately sampling the at least one signal under test and the reference signal in an interleaved fashion such that the signal under test is sampled in one block and the reference signal is sampled in a subsequent block; and repeating the alternate sampling process until N samples of the at least one signal under test and the reference signal are collected in a series of interleaved sampled waveform blocks, for some positive integer N; and a computer coupled to the computer-readable medium for executing the instructions stored therein.

12. The measurement instrument of claim 8, wherein said input circuit is adapted to receive multiple signals under test, and wherein the alternate sampling conducted by the input circuit includes respectively sampling each of the multiple signals under test and then the reference signal such that each measurement block includes one sample from each signal under test and one sample from the reference signal.

13. The measurement instrument of claim 8, wherein said processor circuit is further configured to subtract a calibrated value of a predetermined parameter for the reference signal from the average of the selected reference signal samples before the average of the selected reference signal samples is subtracted from the average of the selected signal under test samples.

14. The measurement instrument of claim 8, wherein the processor circuit is further configured to control the input circuit sampling such that time duration of each sampled block of the at least one signal under test and the reference signal is at least ten times smaller than the inverse of the upper threshold of the low frequency noise that is to be reduced.

15. The measurement apparatus of claim 8, further comprising a display device for displaying the at least one measured signal characteristic as output to a user.

16. The measurement apparatus of claim 8, wherein said processor circuit controls said at least one measurement channel to measure the propagation delay between at least one input and at least one output of the device under test.

17. The measurement apparatus of claim 16, wherein the at least one signal under test provided to the input circuit comprises the at least one input of the device under test, and wherein the reference signal provided to the input circuit comprises the at least one output of the device under test.

18. A method of measuring signals provided from a device under test to reduce low frequency measurement instrument noise, said method comprising the steps of:
  providing at least one signal under test from a device under test to a measurement instrument;
  providing a reference signal to the measurement instrument;
  alternately sampling the at least one signal under test and the reference signal in an interleaved fashion such that the signal under test is sampled in one block and the reference signal is sampled in a subsequent block;
  repeating the alternate sampling process until N samples of the at least one signal under test and the reference signal are collected in a series of interleaved sampled waveform blocks, wherein N is a positive integer;
  measuring at least one signal characteristic of the interleaved sampled waveform blocks;
  providing an output indicative of the at least one measured signal characteristic; and
  wherein the time duration of each sampled block of the at least one signal under test and the reference signal is at least ten times smaller than the inverse of an upper threshold of the low frequency noise that is to be reduced.

* * * * *